United States Patent [19]

Morgan et al.

[11] Patent Number: 5,381,368
[45] Date of Patent: Jan. 10, 1995

[54] HARDWARE IMPLEMENTED ROW COPY ENABLE MODE FOR DRAMS TO CREATE REPETITIVE BACKGROUNDS FOR VIDEO IMAGES OR DRAM TESTING

[75] Inventors: Donald M. Morgan; Michael A. Shore, both of Boise, Id.

[73] Assignee: Micron Semiconductor, Inc., Boise, Id.

[21] Appl. No.: 165,773

[22] Filed: Dec. 10, 1993

[51] Int. Cl.⁶ .............................................. G11C 11/40
[52] U.S. Cl. ........................ 365/189.01; 365/189.12; 365/701; 365/220
[58] Field of Search ................ 365/189.01, 189.04, 365/189.12, 201, 220, 221, 230.03

[56] References Cited

U.S. PATENT DOCUMENTS

| | | | |
|---|---|---|---|
| 4,141,081 | 2/1979 | Herve et al. | 365/203 |
| 4,533,843 | 8/1985 | McAlwander, III et al. | 307/530 |
| 4,543,500 | 9/1985 | McAlexander, III et al. | 307/530 |
| 4,606,010 | 8/1986 | Sath | 365/149 |
| 4,634,901 | 1/1987 | McElroy | 307/530 |
| 4,636,987 | 1/1987 | Norwood et al. | 365/208 |
| 4,748,349 | 5/1988 | McAlexander, III et al. | 307/530 |
| 4,962,326 | 10/1990 | Parkinson et al. | 307/443 |
| 5,042,011 | 8/1991 | Casper et al. | 365/205 |

Primary Examiner—Terrell W. Fears
Assistant Examiner—F. Niranjan
Attorney, Agent, or Firm—Wells, St. John, Roberts, Gregory & Matkin

[57] ABSTRACT

There is a hardware implemented row copy operation mode for a DRAM to relieve the VRAMs from this slower repetitive operation. In addition, by providing circuitry that will generate a solid repetitive pattern for the full or portions of the screen. Another advantage of the invention occurs during testing of a DRAM with this circuitry. By having the ability of filling the memory array with, for example all digital ones in each cell, the quality of the die can easily be tested by modifying individual cells with a digital zero. Uniquely, this circuitry relieves the testing circuitry from filling in a background of information like the all ones background. Another feature of the invention allows graphic cards that exclusively use DRAMs, to eliminate the additional circuitry needed to perform the row copy feature, or creation of backgrounds.

3 Claims, 3 Drawing Sheets

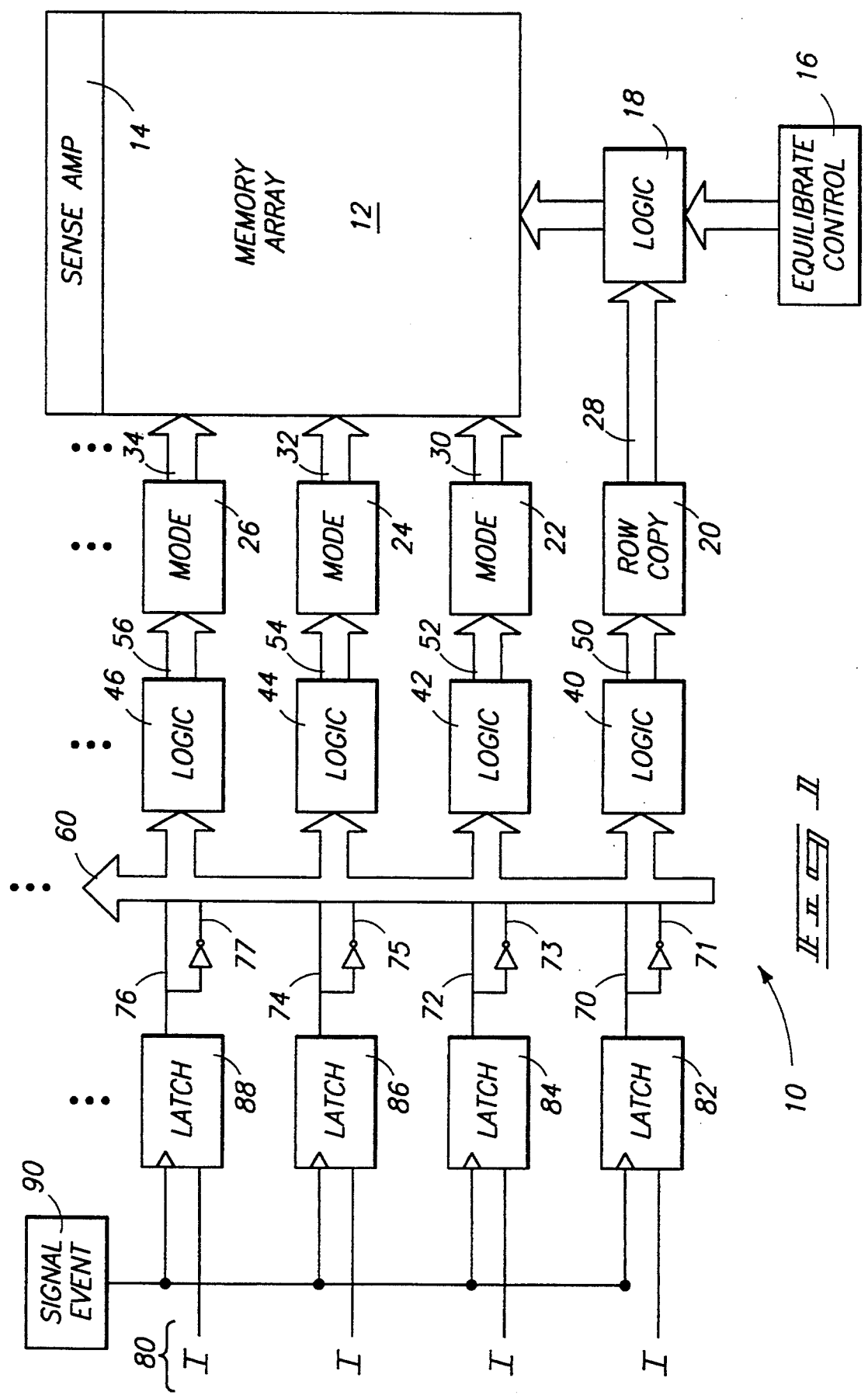

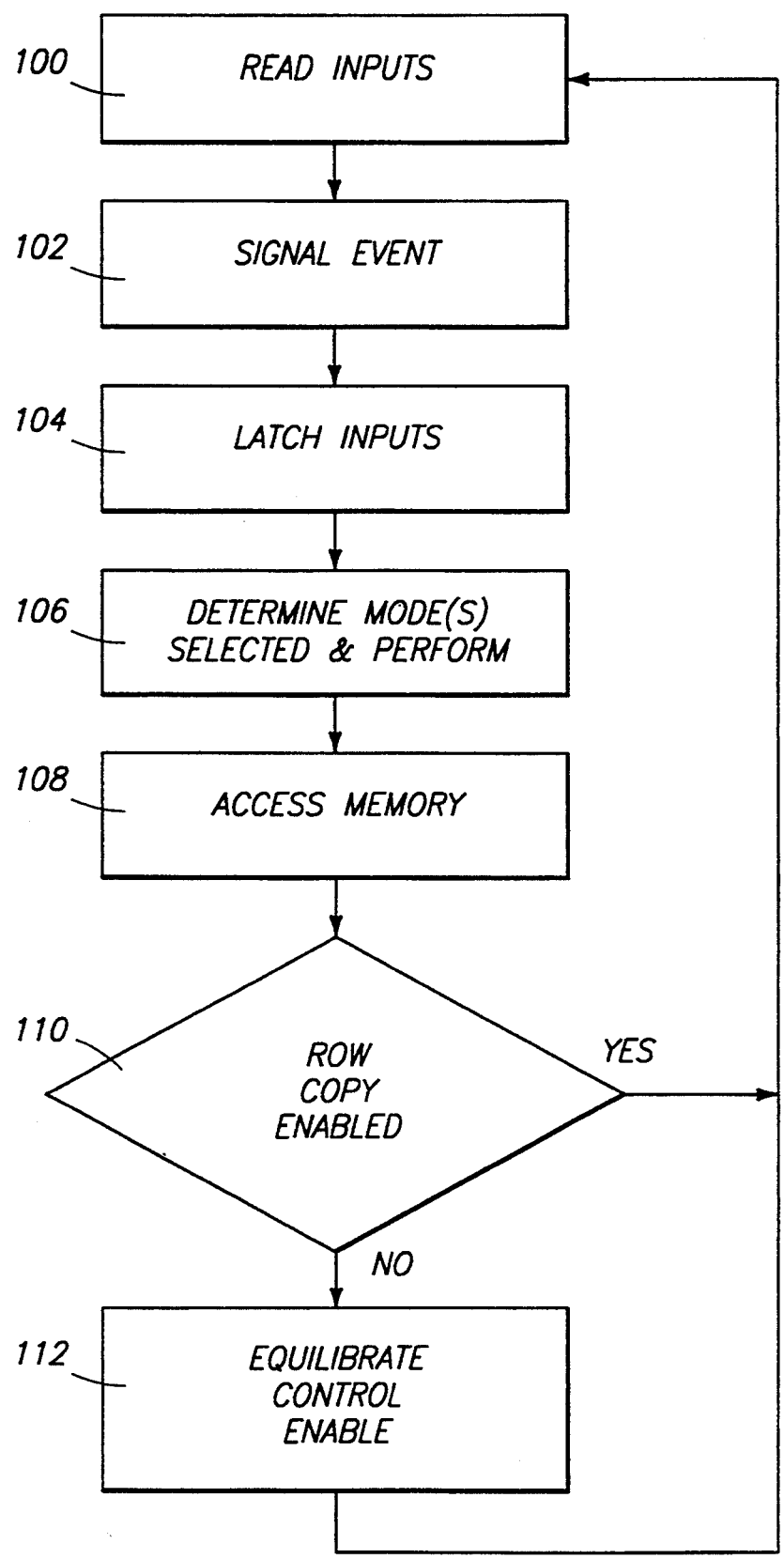

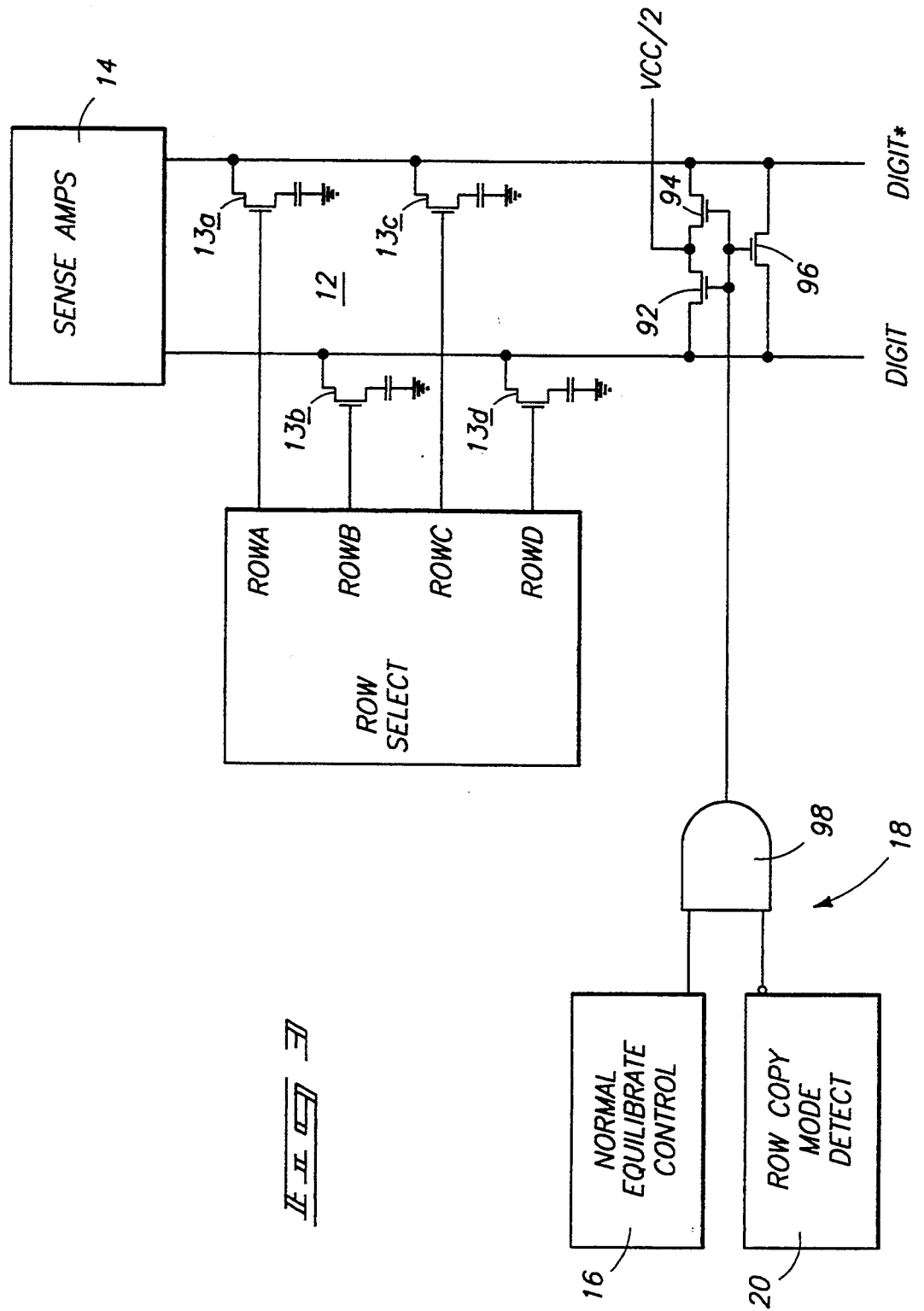

HARDWARE IMPLEMENTED ROW COPY ENABLE MODE FOR DRAMS TO CREATE REPETITIVE BACKGROUNDS FOR VIDEO IMAGES OR DRAM TESTING

FIELD OF THE INVENTION

The present invention relates to integrated circuits (ICs). Particularly, there is a DRAM circuit that provides for repeating a video background image. Uniquely, the new circuit (or mode) will determine when to skip the voltage equilibrate step, thus preventing the destroying of the video image signals that are needed to be repeated.

BACKGROUND OF THE INVENTION

VRAMs and DRAMS, are well-known in the art. Typically, VRAMs incorporate more circuitry, like SAMs, to enable faster memory speeds which are required by video imaging processes. However, DRAMs have had a small market in the video arena. Specifically, when customers do not require the faster access speeds, a DRAM has adequate speeds and is less expensive to use.

One particular use for a VRAM, is to perform a "row copy" operation. This operation is used when there's a solid block area on a video screen that requires a repetition of information. For example, most people will be familiar with background images in word processing screen displays. Where the screen is all green or blue, and the operator types over in another color for the text. The solid block area is created by a row copy operation. Where each bit of memory information is the same for each column and row in the memory array assigned to that block of color.

PROBLEMS

Although uniform backgrounds are used quite often in today's programs, VRAM users have had to design software to implement this repetitive operation. Unfortunately, separate software programs have to be written for the wide variety of VRAMs in use today. Additionally, using a VRAM for this repetitive row copy routine is a waste of resources. Row copy, or background creation, does not require the faster speeds provided by the VRAMs. Unfortunately, it is not possible to write software programs for DRAMs to perform this repetitive task. If a DRAM could be designed to generate the background picture, or do the row copy routine, this would relieve the VRAM of this repetitive and slower task. Thus enabling a less expensive ICs (DRAMs) to perform background creation and allowing more of the higher speed operations to be performed by the more expensive ICs (VRAMs).

Another problem occurs when graphic cards only use DRAMs. To perform the background copy or row copy mode, these cards need other circuitry on the PCB to perform this operation. If row copy were implemented on the DRAM chip, the PCB could be made cheaper, and more real estate would be available for other features to be added to the card. However, even better, would be the advantage of providing the same features as before on a smaller and less expensive PCB, and only using the DRAMs.

It is noted that the above described problems, as well as other problems, are solved through the subject invention and will become more apparent, to one skilled in the art, from the detailed description of the subject invention.

SUMMARY OF THE INVENTION

One skilled in the VRAM and DRAM dual usage arts will appreciate the advantages of a hardware enabled row copy operation mode for a DRAM to relieve the VRAMs from this slower repetitive operation. In addition, by providing circuitry that will generate a solid repetitive pattern for the full or portions of the screen.

Another advantage of the invention occurs during testing of a DRAM with this circuitry. By having the ability of filling the memory array with, for example all digital ones in each cell, the quality of the die can easily be tested by modifying individual cells with a digital zero. Uniquely, this circuitry relieves the testing circuitry from filling in a background of information like the all ones background.

Another feature of the invention allows graphic cards that exclusively use DRAMs, to eliminate the additional circuitry needed to perform the row copy feature, or creation of backgrounds.

Other features and advantages of the present invention may become more clear from the following detailed description of the invention, taken in conjunction with the accompanying drawings and claims, or may be learned by the practice of the invention.

BRIEF DESCRIPTION OF THE DRAWINGS

FIG. 1 is a block diagram illustrating the concept and details of the invention.

FIG. 2 is a detailed illustration of the operation of the invention to enable row copy for blocks of repetitive information to be generated.

FIG. 3 is a preferred embodiment of the invention.

It is noted that the drawings of the invention are not to scale. The drawings are merely schematic representations, not intended to portray specific parameters of the invention. The drawings are intended to depict only typical embodiments of the invention, and are therefore not to be considered limiting of its scope. The invention will be described with additional specificity and detail through the use of the accompanying drawings, specification, and claims. Additionally, like numbering in the drawings represent like elements within and between drawings.

DETAILED DESCRIPTION OF THE ILLUSTRATED EMBODIMENT

This disclosure of the invention is submitted in furtherance of the constitutional purposes of the U.S. Patent Laws "to promote the progress of science and useful arts" (Article 1, Section 8 of the U.S. Constitution).

Incorporated Material

The following U.S. patents are herein incorporated by reference for pertinent and supporting information:

U.S. Pat. No. 5,042,011 is a sense amplifier pulldown device with tailored edge input.

U.S. Pat. No. 4,962,326 having same assignee as the present invention, is a reduced latchup in precharging I/O lines to sense amp signal levels.

U.S. Pat. No. 4,748,349 is a high performance dynamic sense amplifier with voltage boost for row address lines.

U.S. Pat. No. 4,636,987 is a semiconductor dynamic memory device with multiplexed sense amplifier and write activated active loads.

U.S. Pat. No. 4,634,901 is a Sense amplifier for CMOS semiconductor memory devices having symmetrically balanced layout.

U.S. Pat. No. 4,606,010 is a dynamic memory device.

U.S. Pat. No. 4,533,843 is a high performance dynamic sense amplifier with voltage boost for row address lines.

U.S. Pat. No. 4,543,500 is a high performance dynamic sense amplifier voltage boost for row address lines.

U.S. Pat. No. 4,141,081 is a MNOS BORAM sense amplifier latch.

GENERAL EMBODIMENT

FIG. 1 is a block diagram illustrating the concept and details of the invention. Specifically, one skilled in the DRAM or VRAM design arts will easily understand how to implement the details of the block diagram. FIG. 1 has the following elements: There is a DRAM 10, with a memory array 12, sense amps 14, equilibrate control 16, and equilibrate logic 18. A row copy mode 20, and at least three other memory modes of operation 22, 24, and 26 are coupled to the memory array 12 or equilibrate control via appropriate buses 28, 30, 32, and 34. There are paired logic circuitry 40, 42, 44, 46, coupled to the respective modes 20-26 via associated buses 50, 52, 54, 56, for enabling each mode to be activated or not. Bus 60, receives all of the true and complement signals from nodes 70-77 respectively, from input signals "I" 80, via latching devices 82, 84, 86, and 88, respectively. Signal event 90 is coupled to all latching devices.

FIG. 2 is a detailed illustration of the operation of the invention to enable the determination of what modes to perform upon the memory array, including the inventive row copy mode used for blocks of repetitive information to be generated in the array memory to be later used for testing or video background data.

In particular, one skilled in the art will recognize the familiar sequence of events for generating performance modes for the memory array 12. However, this invention introduces an additional decision step concerning the row copy mode as is apparent from the drawings.

At step 100, the input signals "I" are read. A signal event 90 is then triggered to latch the input signals "I" in latches 82-88 (steps 102 and 104). One or more modes of operation are selected and performed at step 106. The memory array 12 is then accessed to read, write, or otherwise manipulate the data according to the desired mode of operation (step 108).

At step 110, a check is made to determine whether row copy 20 is enabled. If it is enabled, the equilibrate operation from control 16 is skipped. Flow returns to step 100 where new inputs are read and latched (steps 100-104) and a new location of memory cells, such as the next adjacent row, can be accessed (step 108). Because there was no equilibrate operation, the digit lines retain the same data information. Thus, when the next row of memory is accessed, the same data is copied onto this row without losing the first row of data.

On the other hand, if row copy 20 is not enabled (i.e., the "no" branch from step 110), the equilibrate control 16 is enabled to remove the data from the digit lines in preparation for receiving new data for the memory cells.

FIG. 3 is a preferred embodiment of the invention where logic 18 is implemented as an AND gate 98. Memory array 12 has multiple rows A, B, C, and D coupled to multiple memory cells, as represented by respective memory cells 13a-13d. It is noted that the three transistors 92, 94, and 96 on the bottom of the figure represent an equilibrate circuit. Thus, by use of the logical AND gate 98 the row copy mode can be enabled or disabled for the memory array cells illustrated. For purposes of the continuing discussion, suppose that row A is initially accessed via steps 100-108 (FIG. 2) and data is placed on paired digit lines DIGIT/DIGIT* to be stored in the memory cells on row A (as represented by memory cell 13a). If row copy mode 20 is enabled, AND gate 98 outputs a low voltage level regardless of the state of equilibrate control 16 and thus transistors 92-96 are turned "off". Accordingly, the data on paired digit lines DIGIT/DIGIT* remains. When another row is accessed (for example, row B) during steps 100-108 (FIG. 2), the data on the digit lines is copied onto the newly accessed row of memory cells (such as memory cell 13b on row B). This is done without any data loss on row A because access to the memory cells of row A is terminated to complete the first access cycle before access to row B is commenced, thereby isolating the memory cells in row A for data retention.

Conversely, if row copy mode 20 is disabled and equilibrate control 16 is enabled, AND gate 98 outputs a high voltage level to turn "on" transistors 92-96. With these transistors "on", the digit lines DIGIT/DIGIT* are shorted together to equalize their voltage potential to Vcc/2, thereby removing the data thereon.

REMARKS ABOUT THE INVENTION

It is noted that all of the determined modes to be perform on the memory array are performed before the performance of the row copy mode is enabled. This is obviously done at this time because there will be a repeat of the last information stored in the selected row of memory and maybe a repeat or a change of the other modes. In any case, it is important not to equilibrate the DRAMbit lines in order to preserve the information for the next repetitive row copy step.

It should be pointed out that the information on a single row can be copied to any other arbitrary row that is sharing digit lines in the memory array.

It is further noted that, this invention allows a DRAM to perform the generation of background information and or storage in the memory array via a hardware mode. Thus, emulating a mode that was relegated exclusively to VRAMs which was created by software programming.

It is also obvious to one skilled in the art that the read inputs step is the receiving of the signals routed to the DPAM that will be decoded to determine what modes will be performed at that particular time of the DRAM operation.

When discussing differing modes of operation for the invention, one skilled in the art will know of many such modes. For example, there are flash modes, block write modes, read modes, and etc.

Additionally, it is easily understood that once equilibration is undertaken, all data that was accessed will be destroyed in preparation for receiving new data for the memory cells. Thus, by skipping that operation, the same data is reused for the next row or rows to create a background.

Although not shown on FIG. 1, one skilled in the art will know that the equilibrate circuitry is located in the memory block 12.

The current invention now relieves the VRAM of simple background creations by a less expensive DRAM device.

VARIATIONS IN THE INVENTION

There are several obvious variations to the broad invention and thus come within the scope of the present invention. Specifically, any form of repetitive design can also be implemented by this invention. For example, creation of a repetitive weave pattern on the screen, or repetitive boxes across the screen are common backgrounds. This is similar for testing purposes, where, for example, only every fifth row has digital zeros in it, while the remainder of the array maintain digital ones.

In addition, and referring to the signal event 90, there are any number of signals that may trigger the latching of the data in the latches. For example, the rising of the RAS signal, or even the falling of it, or the same rise and fall of the CAS signal could also be used.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

Although subheadings in the Detailed Description of the Illustrated Embodiment are used, these are merely provided for assisting the reader; wherein, the writer is free to enter any information under any heading/s.

What is claimed and desired to be secured by United States Patent is:

1. A DRAM device, comprising:
   a memory array having first and second rows and a plurality of memory cells coupled to the first and second rows; and
   a circuit, located on the DRAM device and electrically coupled to the memory array, for copying data in the memory cells of the first row to memory cells in the second row while maintaining the data in the first row.

2. A DRAM device, comprising:
   a memory array having multiple rows and multiple paired digit lines that intersect one another, the memory array also having a plurality of memory cells coupled at intersections of individual rows and paired digit lines, the paired digit lines being used to carry data to and from the memory cells;
   an equilibrate control, electrically coupled to the digit lines of the memory array, to erase data on the paired digit lines; and
   a copy circuit, located on the DRAM device and electrically coupled to the memory array and the equilibrate control, for copying data carried by the paired digit lines and placed in a first row of memory cells to at least another row of memory cells by suspending activation of the equilibrate control to prevent erasure of the data on the paired digit lines.

3. A DRAM device, comprising:
   a memory array having 1) multiple rows electrically coupled to plural memory cells, and 2) equilibrate circuitry coupled to the rows;
   an equilibrate control circuit, electrically coupled to the equilibrate circuitry of the memory array, to enable or disable the equilibrate circuitry; and
   a row copy enable circuit, electrically coupled to the memory array and the equilibrate control, for copying data in a first row of memory cells to at least another row of memory cells without activating the equilibrate circuitry.

* * * * *